(12) United States Patent
Yamashita et al.

(10) Patent No.: US 8,321,084 B2
(45) Date of Patent: Nov. 27, 2012

(54) CONTROL DEVICE, CONTROL METHOD, CONTROL DEVICE OF VEHICLE, AND CONTROL SYSTEM OF VEHICLE

(75) Inventors: Shinji Yamashita, Kobe (JP); Takehito Iwanaga, Kobe (JP); Shigeto Umeyama, Kobe (JP)

(73) Assignee: Fujitsu Ten Limited, Kobe (JP)

( * ) Notice: Subject to any disclaimer, the term of this patent is extended or adjusted under 35 U.S.C. 154(b) by 470 days.

(21) Appl. No.: 12/404,028

(22) Filed: Mar. 13, 2009

(65) Prior Publication Data
US 2009/0240392 A1     Sep. 24, 2009

(30) Foreign Application Priority Data
Mar. 18, 2008     (JP) .................................. 2008-069322

(51) Int. Cl.
*G06F 7/00*     (2006.01)
(52) U.S. Cl. ......................................... 701/29.1; 710/68
(58) Field of Classification Search .................... 701/29, 701/33, 35, 1, 29.1, 31.4, 34.4; 707/693, 707/736, 999.101; 340/500, 514; 708/203; 709/247; 710/68
See application file for complete search history.

(56) References Cited

U.S. PATENT DOCUMENTS

| | | | | |
|---|---|---|---|---|
| 4,258,421 A * | 3/1981 | Juhasz et al. | ..................... | 701/35 |
| 4,395,624 A * | 7/1983 | Wartski | ........................... | 377/15 |
| 4,987,541 A * | 1/1991 | Levente et al. | .................. | 701/35 |
| 5,016,009 A * | 5/1991 | Whiting et al. | .................. | 341/67 |
| 5,060,077 A * | 10/1991 | Koya et al. | .................... | 386/247 |
| 5,239,470 A * | 8/1993 | Komatsu | ......................... | 701/35 |
| 5,603,022 A * | 2/1997 | Ng et al. | ........................ | 707/693 |
| 5,748,955 A * | 5/1998 | Smith | ............................ | 707/693 |
| 5,850,565 A * | 12/1998 | Wightman | ........................ | 710/1 |
| 5,983,251 A * | 11/1999 | Martens et al. | ............... | 708/203 |
| 5,999,112 A * | 12/1999 | Omori | ............................ | 341/76 |
| 5,999,936 A * | 12/1999 | Pattison et al. | ....................... | 1/1 |
| 6,006,232 A * | 12/1999 | Lyons | ................................... | 1/1 |
| 6,038,371 A * | 3/2000 | Shimoda et al. | ............... | 386/329 |
| 6,374,250 B2 * | 4/2002 | Ajtai et al. | ............................ | 1/1 |
| 6,389,340 B1 * | 5/2002 | Rayner | .......................... | 701/35 |
| 6,393,149 B2 * | 5/2002 | Friederich et al. | ............ | 382/173 |
| 6,463,179 B1 * | 10/2002 | Kondo et al. | ................. | 382/239 |
| 6,535,804 B1 * | 3/2003 | Chun | ............................. | 701/35 |
| 6,609,051 B2 * | 8/2003 | Fiechter et al. | ................. | 701/33 |

(Continued)

FOREIGN PATENT DOCUMENTS
JP     A 6-217110     8/1994

*Primary Examiner* — Darnell Jayne
*Assistant Examiner* — Sasha T Varghese
(74) *Attorney, Agent, or Firm* — Oliff & Berridge, PLC

(57) ABSTRACT

Provided is a control device including: a storage portion for storing binary data transmitted from outside and received successively; and a control portion for carrying out processing including: production processing of producing a frame where of the stored binary data, pieces of data expressing events occurring in a predetermined period are placed into a group among which pieces of data expressing events each having a small degree of variation are arranged so as to be close to each other; difference computing processing of arranging the frames produced at intervals of the predetermined time in a predetermined order and of computing a difference between two adjacent frames; compression processing of compressing a result of the computation by a run length method; and recording processing of recording, to a recording portion, a first frame in the difference computing processing, a number of difference computations, and the compressed data.

10 Claims, 13 Drawing Sheets

U.S. PATENT DOCUMENTS

| | | | |
|---|---|---|---|
| 6,618,851 B1 * | 9/2003 | Zundel et al. | 717/103 |
| 6,950,041 B2 * | 9/2005 | Chu | 341/51 |
| 7,028,251 B2 * | 4/2006 | Draper | 715/229 |
| 7,111,142 B2 * | 9/2006 | Spencer et al. | 711/170 |
| 2004/0037461 A1 * | 2/2004 | Lainema | 382/166 |
| 2005/0117610 A1 * | 6/2005 | Chevallier et al. | 370/521 |
| 2005/0219075 A1 * | 10/2005 | Storer et al. | 341/51 |
| 2006/0059173 A1 * | 3/2006 | Hirsch et al. | 707/100 |
| 2007/0168320 A1 * | 7/2007 | Borthakur et al. | 707/1 |
| 2009/0082919 A1 * | 3/2009 | Hershey et al. | 701/35 |
| 2010/0019965 A1 * | 1/2010 | Xiao | 342/357.06 |

\* cited by examiner

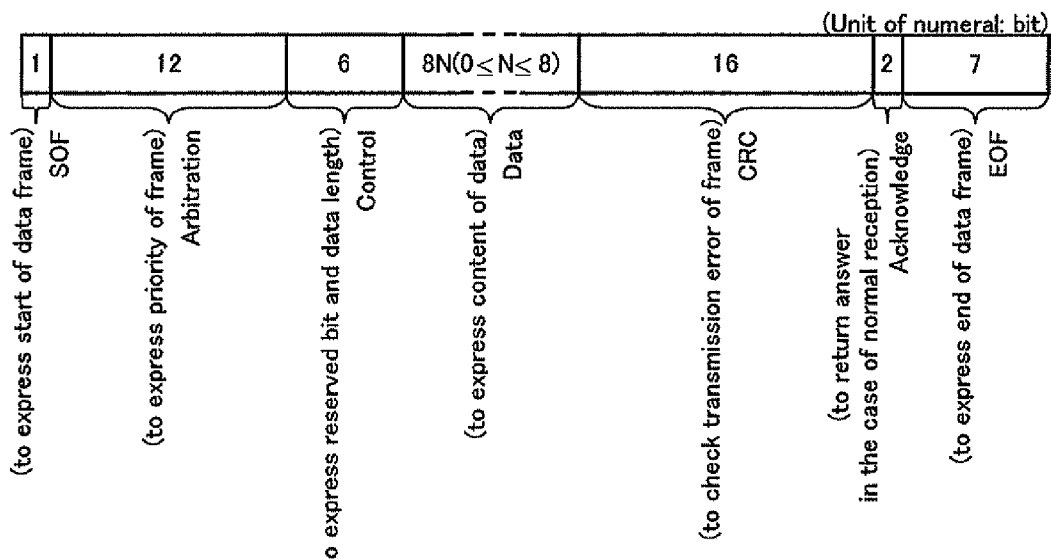

CONTROL DEVICE, CONTROL METHOD, CONTROL DEVICE OF VEHICLE, AND CONTROL SYSTEM OF VEHICLE

This application is based on an application No. 2008-069322 filed in Japan, the contents of which are hereby incorporated by reference.

BACKGROUND OF THE INVENTION

1. Field of the Invention

The present invention relates to a control device, a control method, a control device of a vehicle, and a control system of a vehicle that compresses binary data expressing an external varying event and records the compressed binary data.

2. Description of the Related Art

As a control device that manages binary data received successively from a plurality of electronic control units through a network, for example, a diagnostic recorder is mounted in a vehicle.

In the diagnostic recorder, of various kinds of control data transmitted at any time from respective electronic control units through a CAN bus and used for a failure diagnosis and analysis, at least the newest control data is compiled as frame data at predetermined intervals and is stored in a storage device.

The control data like this is very large in amount, so that the diagnostic recorder is usually configured to be built in a navigation system provided with a large capacity storage device such as a hard disk device and to store the control data in the hard disc.

In the diagnostic recorder, the control data of an amount of about 200 bytes is stored at one time at intervals of 500 msec and control data equivalent to at least 120 hours is required to be held.

However, the navigation system is not always provided with a hard disc device having a large capacity, and a vehicle not provided with such a large capacity storage device has the problem of difficulty in accumulating the control data.

Further, even in the case where the vehicle is provided with a storage device having a large capacity, to realize the functions of a navigation system such as the guiding of the vehicle to a destination and the outputting of images and voices to an audio-visual device, the hard disc device is required to have a storage region large enough to store a large amount of music data, image data, moving picture data, map data, and the like, which presents also such a problem that to secure a large storage region for this purposes is not desirable.

In view of these circumstances, it can be thought that the diagnostic recorder is provided with a storage device made of a semiconductor memory such as an EEPROM and that control data is subjected to a compression processing, thereby being reduced in amount and then stored.

However, a general-purpose compression processing algorithm capable of efficiently compressing a large amount of image data is an irreversible compression method and hence cannot decode the image data correctly. Thus, the general-purpose compression processing algorithm cannot be used for the compression processing of the control data.

As a reversible compression algorithm generally having a large compressing ratio, there have been proposed algorithms such as SLC (Super Lossless data Compression) employing statistical modeling and ELC (Embedded Lossless data Compression) employing dictionary-type modeling.

The statistical modeling is a method that computes the probability of a character (usually, one byte) appearing in a predetermined run of characters (context) and that assigns a symbol to the probability to thereby reduce the amount of data.

The dictionary-type modeling is a method that stores a sentence appearing in the past as it is in a RAM as a dictionary, compares a newly read sentence with the dictionary to search repetitions of characters, and assigns a symbol to a run of repeated characters assuming that the run of repeated characters is a copy of the sentence appearing in the past, thereby reducing the amount of data.

However, these compression algorithms need a working area from several tens of kbytes to several hundreds of kbytes and hence the diagnostic recorder provided with a RAM having a capacity from several kbytes to several tens of kbytes cannot employ these compression algorithms.

On the other hand, the Japanese Unexamined Patent Publication No. 6-217110 discloses the following image conversion method: that is, when an image conversion such as enlarging, contracting, or processing an image is carried out, the binary data of an input image is encoded by a byte unit of run length and the image conversion is carried out on the basis of the encoded data of the byte unit of run length.

However, the above-mentioned control data varies largely depending on the state of the vehicle such as states where the vehicle is running, idling, or has its engine stopped, so that there is presented such a problem that even if the control data is subjected to the compression processing by the use of the run length method described in the above-mentioned patent publication, a compression effect cannot be produced as much as desired.

This problem is not limited to the control device such as the diagnostic recorder mounted in the vehicle but is a problem that holds true for all the control devices for storing a plurality of pieces of binary data each having a large degree of variation in a storage portion by the unit of a frame at predetermined time intervals.

SUMMARY OF THE INVENTION

In view of the above-mentioned problems in the related art, the object of the present invention is to provide a control device, a control method, a control device of a vehicle, and a control system of a vehicle that can efficiently store a plurality of pieces of varying binary data in a recording portion at predetermined time intervals.

To achieve the above-mentioned object, a control device according to the present invention is a control device that compresses binary data expressing an external varying event and records the compressed binary data and is configured to include: a storage portion for accumulating and storing binary data received successively from outside; and a control portion for carrying out processing including: a production processing of producing a frame in which of a plurality of pieces of binary data accumulated and stored in the storage portion, pieces of data expressing events occurring in a predetermined period are placed into a group among which pieces of data expressing events each having a small degree of variation are arranged so as to be close to each other; difference computing processing of arranging a plurality of frames produced at intervals of the predetermined time by the production processing in a predetermined order and of computing a difference between two adjacent frames; compression processing of compressing a computation result of the difference computing processing by a run length method; and recording processing of recording, to a recording portion, a first frame in the difference computing processing, a number of difference computations, and the data compressed by the compression processing.

Further, the other aspects of the present invention will become more apparent by referring to the following embodiments.

BRIEF DESCRIPTION OF THE DRAWINGS

FIG. 5A is a diagram showing a configuration of frame data that each ECU transmits; FIG. 5B is a diagram showing a configuration of a date field of the frame data that each ECU transmits; and FIG. 5C is a diagram showing a configuration of frame data that a frame producing portion produces.

DETAILED DESCRIPTION OF THE PREFERRED EMBODIMENTS

Hereinafter, an example will be described in which a control device according to the present invention is applied as a control device of a vehicle (hereinafter referred to as "data processing device of a vehicle") to a control system of the vehicle (hereinafter referred to as "data processing system of a vehicle").

Figure 1:
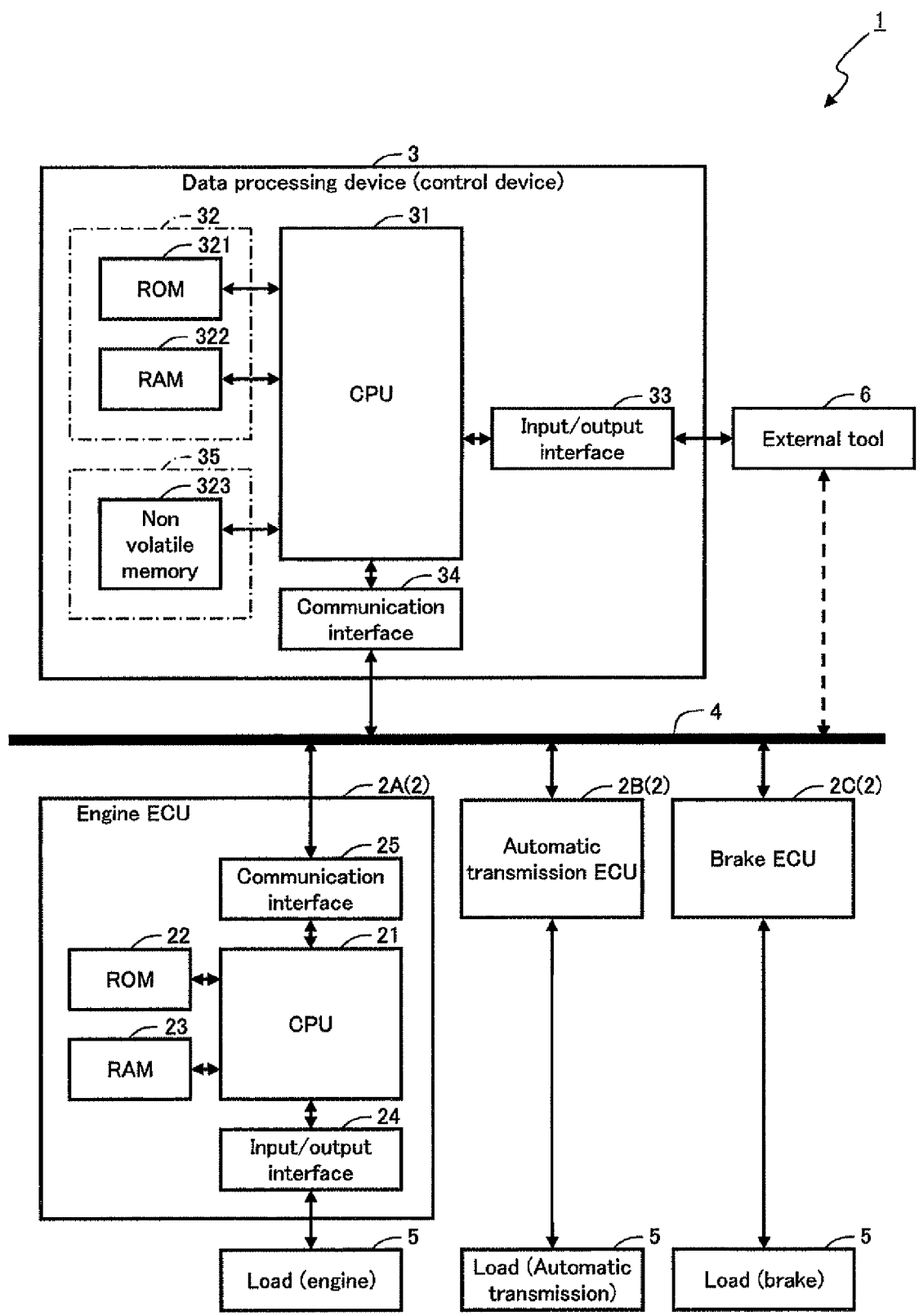
FIG. 1 is a functional block diagram of a control system of a vehicle (data processing system of a vehicle).

Referring to FIG. 1, a plurality of electronic control units (hereinafter referred to as "ECUs") 2 for controlling controlled portions such as an engine mounted in a vehicle and a data processing device 3 of the vehicle according to the present invention are connected to each other through a network 4, whereby the data processing system 1 of the vehicle is configured.

The data processing device 3 accumulates and stores in a storage portion 32 control data that is binary data received successively from each ECU 2 through the network 4.

While only three ECUs 2 are shown in FIG. 1, the vehicle is provided with a larger number of ECUs 2.

As the network 4, a CAN (Control Area Network), which is a standard of a vehicle-mounted network, is employed, but the network 4 is not limited to the CAN. The network 4 may be configured of not only the CAN but also another network such as an Ethernet (trademark of Xerox Corporation) or a LIN (Local Interconnect Network), insofar as data can be transmitted and received appropriately between the ECUs 2.

Each of the ECUs 2 includes a CPU 21, a ROM 22 in which a control program executed by the CPU 21 is stored, a RAM 23 used as a working area, an input/output interface circuit 24, and a communication interface circuit 25.

A control signal is output to a load of a control object and a detection signal of a sensor built in the load and the like are input to the ECUs 2 via the input/output interface circuit 24.

The transmission and reception of data between the CPU 21 and the other ECUs 2 and data processing device 3 through the network 4 are controlled by the transmission interface circuit 25.

The ECUs 2 are connected, via the input/output interface circuit 24, to the loads 5 built in a plurality of controlled portions constituting the vehicle such as an engine, an automatic transmission, and a brake, respectively resulting in an engine ECU 2A, an automatic transmission ECU 2B, and a brake ECU 2C.

In each of the ECUs 2 the CPU 21 executes a control program stored in the ROM 22 to execute a predetermined control operation in response to an input value from a sensor and the like for detecting the state of the load 5 to produce and output a control signal for each load 5, thereby making each load 5 perform a predetermined operation.

The loads 5 include an injector built in the engine and a solenoid built in the automatic transmission, and the sensors include an intake air temperature sensor, a throttle position sensor, and an AT oil temperature sensor. These sensors communicate the operating states of the loads 5 to the ECUs 2.

The operations of the engine ECU 2A and the automatic transmission ECU 2B will be described below as operating examples of the ECUs 2.

Figure 2:
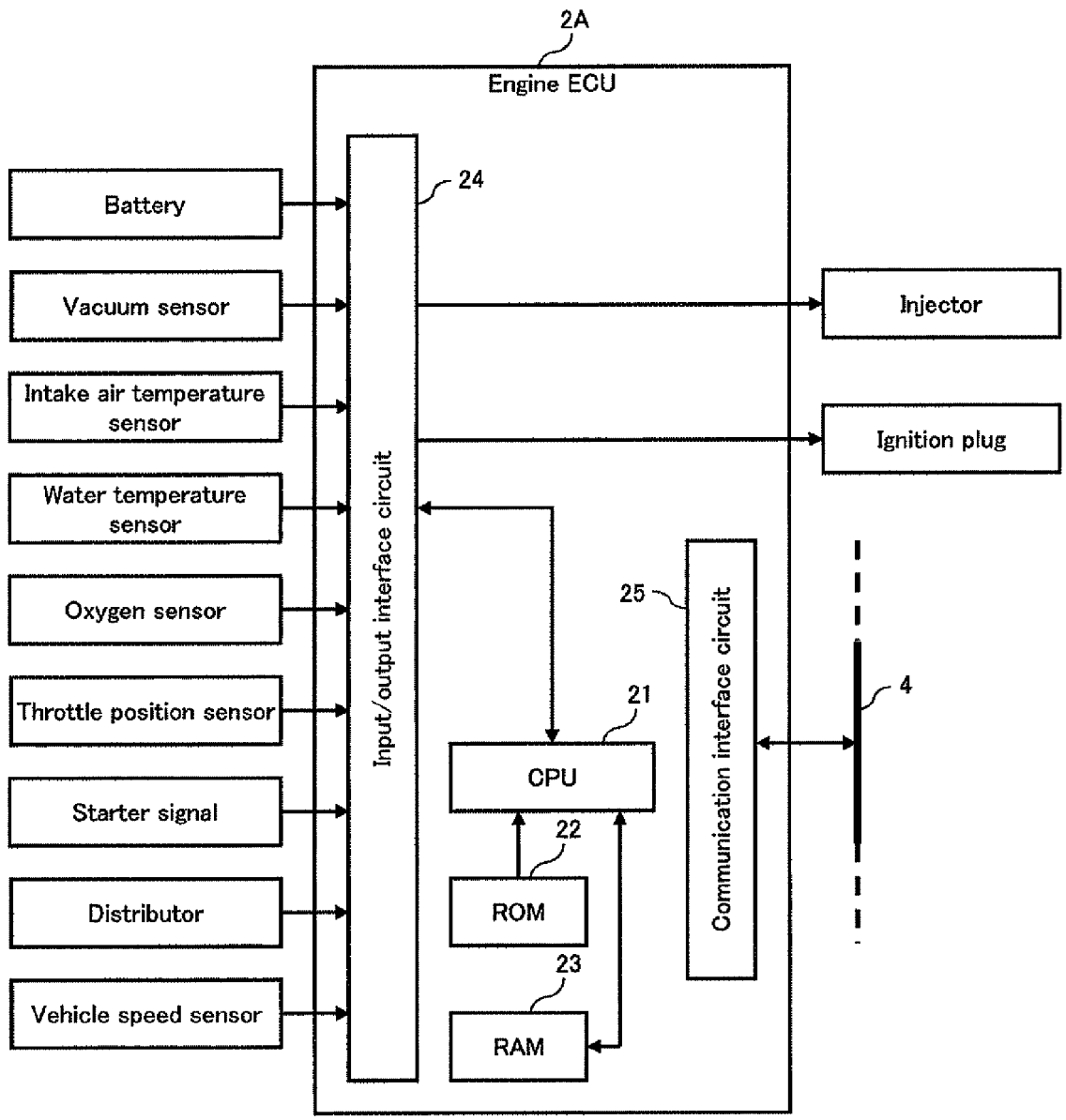
FIG. 2 is a functional block diagram of an engine ECU.

Referring to FIG. 2, the engine ECU 2A accepts input of detection values of the intake air temperature sensor, the throttle position sensor, and the like via the input/output interface circuit 24, and the CPU 21 computes and derives control signals such as the number of revolutions of the engine and the openness of a throttle from the detection values.

The engine ECU 2A outputs control signals computed and derived by the CPU 21 to the injector, the ignition plug, and the like via the input/output interface circuit 24 to control the injection amount of fuel to the engine, an ignition timing of the engine, and the like.

Figure 3:
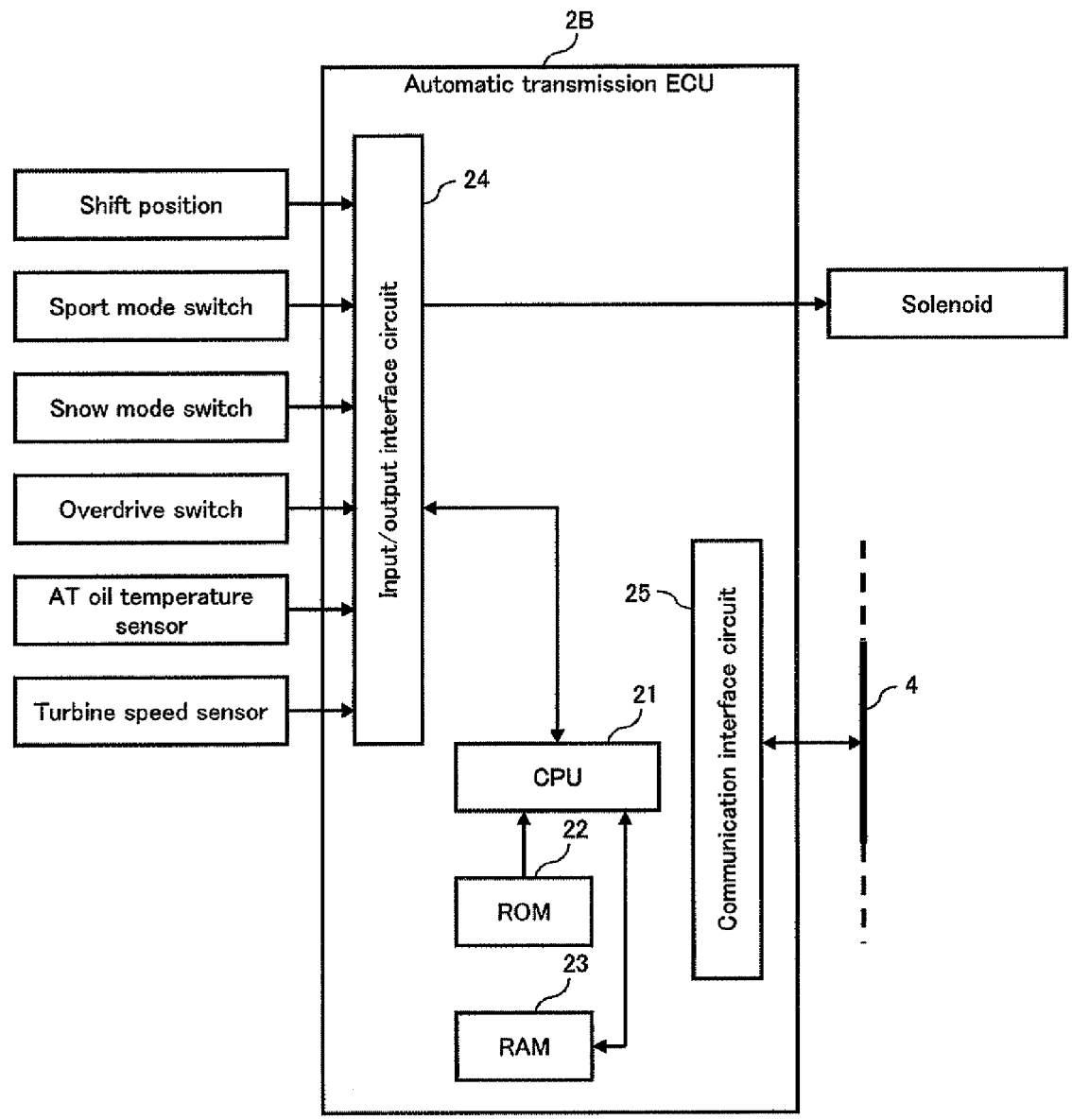
FIG. 3 is a functional block diagram of an automatic transmission ECU.

Referring to FIG. 3, the automatic transmission ECU 2B accepts input of detection values of a shift position, an AT oil temperature sensor, and the like via the input/output interface circuit 24, and the CPU 21 computes, for example, a control current value fed to a solenoid and the like from the detection values.

The automatic transmission ECU 2B outputs the control current value and the like computed and derived by the CPU 21 to the solenoid and the like via the input/output interface circuit 24, thereby controlling the pressure of oil supplied to a clutch and the like.

Hereinafter, the data processing device 3 according to the present invention will be described.

Referring to FIG. 1, the data processing device 3 includes a CPU 31 and a storage portion 32 having a ROM 321 in which a control program to be executed by the CPU 31 is stored, a RAM 322 in which control data input from the ECUs 2 is accumulated and stored and which is used as a working area for computation, and the like.

Moreover, the data processing device 3 includes: a recording portion 35 that is configured of a non-volatile memory 323 such as an EEPROM, a hard disk, or the like, and that records control data made by compressing the control data stored in the storage portion 32; an input/output interface circuit 33 for inputting/outputting data from/to an external tool 6; and a communication interface circuit 34 for controlling the transmission and reception of data to and from the ECUs 2 through the network 4.

Here, there is a case where the recording portion 35 is built in the data processing device 3 but there is also the other case where the recording portion 35 is built in an external device such as a navigation device. In the latter case, the data processing device 3 and the recording portion 35 are connected to each other by a wired or wireless communication cable.

The control data stored in the recording portion 35 includes various kinds of control data used for failure diagnosis and analysis and is configured of predetermined input/output signals transmitted and received between each ECU 2 and the load 5, operating data for control, and the like.

The input/output signals are, for example, the detection values input to the ECUs 2 from the sensors, as described above, and control signals output to the loads 5 from the ECUs 2.

In other words, the ECUs 2 output the detection values input from the sensors and the control signals to be output to the loads 5 to the data processing device 3 through the network 4.

The external tool 6 refers to: a general-purpose computer such as a personal computer that installs dedicated applications for reading the control data stored in the data processing device 3 and for carrying out analysis and diagnosis of the control data; an ECU-dedicated data reading tool such as a handy terminal capable of reading data stored in the data processing device 3 and the ECU 2; or the like.

In this regard, the general-purpose computer is configured to be connectable to the ECU-dedicated data reading tool and is configured to take in the control data read from the data processing device 3 by the ECU-dedicated data reading tool.

Moreover, as shown by a broken line in FIG. 1, the external tool 6 may be configured to take in the control data from the data processing device 3 through the network 4.

In the data processing device 3, the CPU 31 serving as a control portion of the present invention executes a control program stored in the ROM 321 constituting the storage portion 32, whereby the function blocks described below can be embodied.

Figure 4:
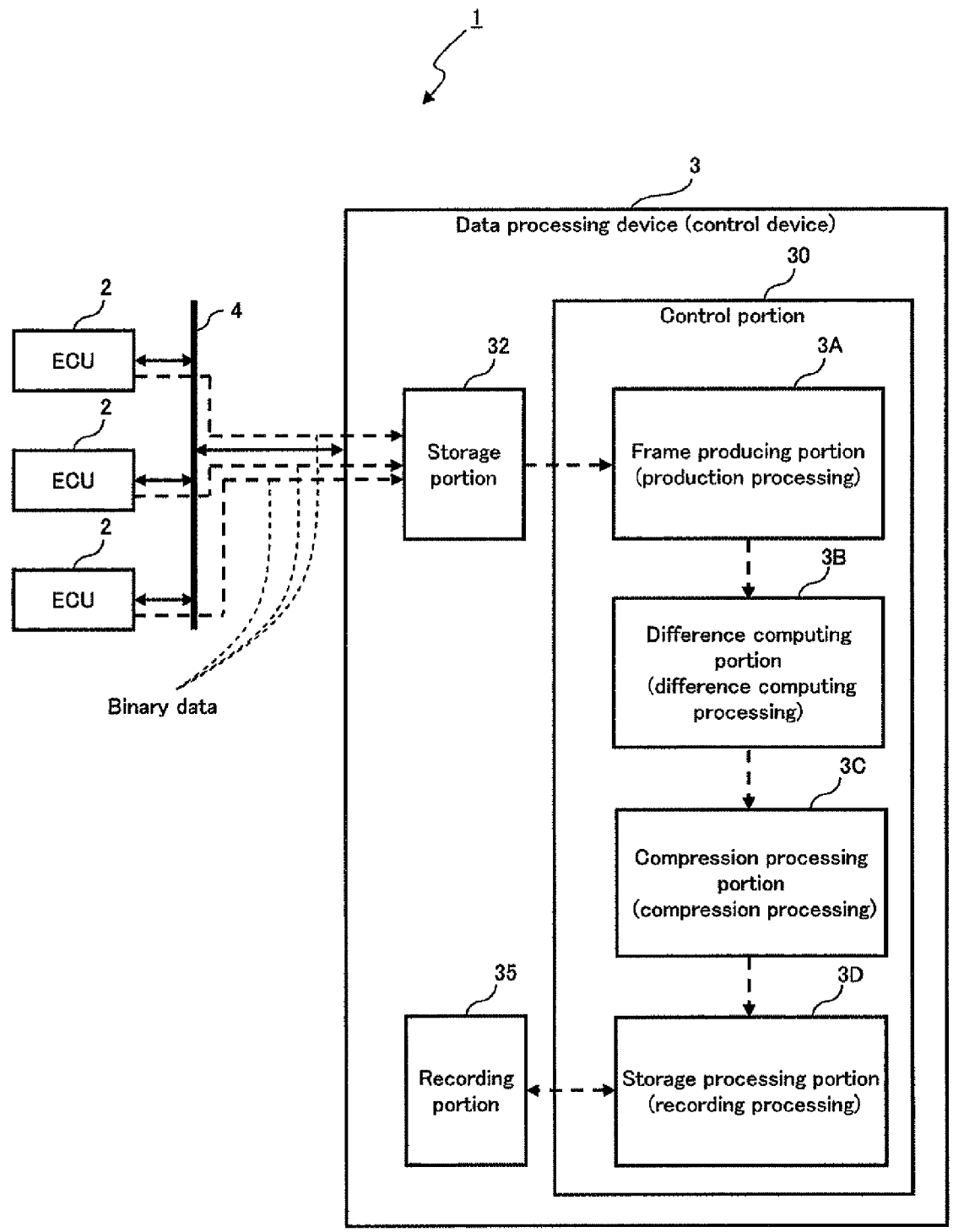
FIG. 4 is a functional block diagram of a control device (data processing device).

Referring to FIG. 4, the data processing device 3 includes: the storage portion 32 (RAM denoted by a reference symbol 322 in FIG. 1) in which binary data expressing an external varying event transmitted successively from the outside through the network 4, that is, the above-mentioned control data is accumulated and stored; and a control portion 30 for compressing the binary data stored in the storage portion 32 and for storing the compressed binary data in the recording portion 35.

The control portion 30 carries out frame producing processing, difference computing processing, compression processing, and recording processing.

In the frame producing processing, a frame is produced in which of a plurality of pieces of binary data accumulated and stored in the storage portion 32, pieces of data expressing events occurring in a predetermined period are placed into a group among which pieces of data expressing events each having a small degree of variation are arranged so as to be close to each other.

In the difference computing processing, a plurality of frames produced at intervals of the predetermined time by the production processing are arranged in a predetermined order and a difference between two adjacent frames is computed.

In the compression processing, a computation result computed in the difference computing processing is compressed by a run length method.

In the recording processing, a first frame in the difference computing processing, the number of difference computations, and the data compressed by the compression processing are recorded to the recording portion 35.

In other words, the control portion 30 includes: a frame producing portion 3A for carrying out the above-mentioned frame producing processing; a difference computing portion 3B for carrying out the difference computing processing; a compression processing portion 3C for carrying out the compression processing; and a storing processing portion 3D for carrying out the recording processing.

The binary data expressing the external varying event, that is, the above-mentioned control data is received through the communication interface 34 at the predetermined time intervals in a binary form and is stored in the storage portion 32.

The external varying event means, for example, the injection amount of fuel to the engine, an ignition timing of the engine, and the like. Moreover, the data expressing an event with a small degree of variation means data expressing an event with a small degree of variation with time in vehicle control, examples including data of the temperature of engine water and the switch of a shift position. The predetermined time means, for example, 500 msec.

The control data has time information added thereto. The time information is the time when the control data is produced by each ECU 2 and can be the time added by each ECU 2. The time information may be the time when the control data is input to the data processing device 3 and may be the time added by the data processing device 3. Alternatively, the time information may be the time when the control data is output from each ECU 2 and may be the time added by each ECU 2.

FIG. 5A shows the configuration of a frame to be transmitted to the data processing device 3 from each ECU 2 through the CAN bus. The above-mentioned control data is arranged in the data field of the frame. In this embodiment, the data field is configured of 8 bytes: that is, in FIG. 5A, N=8.

FIG. 5B shows on its upper row the data field of the frame output from the engine ECU 2A. This data field has arranged therein a total of 8 bytes of binary data including: 7 bytes of control data including the number of revolutions of the engine, an engine water temperature, and a battery voltage; and 1 byte of dummy data (expressed by "vacant" in FIG. 5B).

FIG. 5B shows on its lower row the data field of the frame output from the automatic transmission ECU 2B. This data field has arranged therein a total of 8 bytes of binary data including a speed change position, the number of revolutions of a turbine, the number of revolutions of a primary pulley (NIN), and the number of revolutions of a secondary pulley (NOUT).

The above-mentioned frame producing portion 3A arranges the binary data received from the respective ECUs 2 and stored in the storage portion 32 in an order determined in advance, thereby producing a frame for the data processing device 3, that is, a frame for the compression processing (hereinafter referred to as "frame data").

For example, the frame producing portion 3A refers to the occurrence time of each binary data stored in the storage portion 32 on a data field basis, thereby recognizing the timing at which each binary data occurs.

In this regard, in the case where the ECU 2 adds the occurrence time to the binary data, it suffices to store the time in the data frame of a CAN frame output from each ECU 2. In this case, if the data frame is full of existing data, it suffices to increase the number of bytes constituting the data field. In the case where the data processing device 3 adds the occurrence time to the binary data, it suffices to add the time of reception to each binary data and to store the binary data in the storage portion 32.

Next, the frame producing portion 3A divides each of the binary data into a plurality of occurrence period groups at intervals of a predetermined period on the basis of respective occurrence times of the binary data. Further, the frame producing portion 3A produces frame data in which the binary data belonging to the occurrence period groups are arranged in ascending order of variation degree of the data.

The data variation will be described in detail. The control data transmitted to the data processing device 3 from the ECUs 2 has an index previously set for each of the kinds of control data such as the number of revolutions of the engine and the engine water temperature, the index indicating whether the value of the control data frequently varies or shows substantially no variation.

For example, one trip between the time from when the ignition switch of the vehicle is turned on until the ignition switch is turned off is divided into predetermined time periods in order to obtain a data variation probability on a predetermined time period basis. Then, the variation probability is repeatedly computed under various conditions such as the kind of the vehicle and the surrounding environment in order to set an index from the statistically obtained probabilities.

FIG. 5C shows a configuration example of the frame data in which the data is arranged in ascending order of variation degree of the data. In FIG. 5C, one piece of frame data is composed of an arrangement of n pieces of binary data ranging from the binary data of the shift position, which has a smallest degree of variation, to the binary data of the number of revolutions of the engine, which has a largest degree of variation. In other words, in FIG. 5C, binary data with a smaller numeral value on upper left portion of each section has a smaller degree of variation.

Further, it is statistically found that non-acceleration operation-caused varying data whose variation is not due to an acceleration operation carried out by a driver tends to have a smaller degree of variation than that of acceleration operation-caused varying data whose variation is due to the acceleration operation.

The non-acceleration operation-caused varying data includes the shift position, outside air temperature, outside air pressure, the operating state of a wiper, the operating state of a head light, the operating state of a power window, the locking state of a door, and the operating state of a seat. The acceleration operation-caused varying data includes the number of revolutions of the engine, engine water temperature, vehicle speed, throttle openness, the number of revolutions of the turbine, the number of revolutions of the primary pulley (NIN), the number of revolutions of the secondary pulley (NOUT), the number of revolutions of a driving motor (in the case of a hybrid vehicle), and the number of revolutions of a power generating motor (including the case of a hybrid vehicle).

It is also statistically found that non-engine associated operation data of operations not associated with the engine has a smaller degree of variation than that of engine associated operation data of operations associated with the engine.

The non-engine associated operation data includes the shift position, outside air temperature, outside air pressure, the operating state of the wiper, the operating state of the head light, the operating state of the power window, the locking state of the door, and the operating state of the seat. The engine associated operation data includes the number of revolutions of the engine, engine water temperature, vehicle speed, throttle openness, the number of revolutions of the turbine, the number of revolutions of the primary pulley (NIN), the number of revolutions of the secondary pulley (NOUT), the number of revolutions of the driving motor (in the case of the hybrid vehicle), and the number of revolutions of the power generating motor (including the case of the hybrid vehicle).

It is also found that body system control data associated with the body system control of the vehicle has a smaller number of variation than that of power train system control data associated with power train system control.

The body system control data includes light control, seat control, door control, wiper control, sunroof control, remote keyless entry control, and air bag control. The power train system control data includes engine control, gear control, brake control, and steering assistance control.

The frame data is configured to be able to store 8 bytes of frame data transmitted from each of a maximum of 24 ECUs 2, and the size of the frame data is 194 bytes (=8 bytes×24).

In this regard, the order of data variation in FIG. 5C is only shown for exemplary purposes and not limited to this order. Further, while only the binary data transmitted from the engine ECU 2A and the automatic transmission ECU 2B is shown in FIG. 5C, it will be readily appreciated that the binary data transmitted from the other ECUs 2 is also stored in the frame data produced by the frame producing portion 3A.

The difference computing portion 3B computes a difference between two pieces of frame data of the frame data produced at intervals of the predetermined period by the frame producing portion 3A.

In this regard, the difference between two pieces of frame data is a difference between the frame data currently produced and the frame data formerly produced by the frame producing portion 3A. In other words, the difference computing portion 3B computes a difference between the newest frame data and the frame data produced before a predetermined time, specifically, 500 msec of the time when the newest frame data is produced. The "frame data formerly produced" used for the difference computation becomes the above-mentioned "first frame."

When the difference between the frame data currently produced and the frame data formerly produced by the frame producing portion 3A is computed, the probability that both frame data will be the same becomes comparatively high and hence a compression ratio by the compression algorithm to be described below can be increased.

The compression processing portion 3C compresses the difference frame data computed by the difference computing portion 3B by the run length method.

Figure 6A:
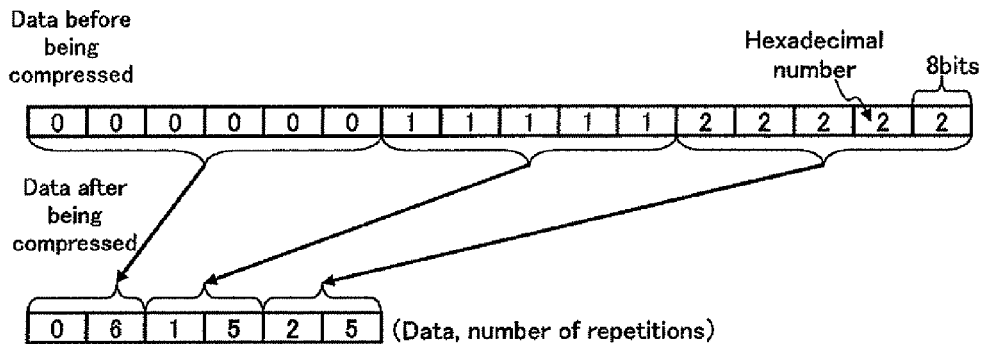
FIG. 6A is a diagram showing data compression by a run length method when the number of repetitions of the same data is large.

Referring to FIG. 6A, the run length method is a method by which, when the same data repeatedly occurs, the run of the data arranged in an arbitrary order is compressed by converting the run of the data into 2-byte data consisting of one byte of each data and one byte of expression of the number of repetitions of the data. This compression method will be hereinafter referred to as a "first encoding method." In this regard, as to the data shown in each square in FIG. 6, 1-byte (8-bit) data is expressed by a hexadecimal number.

Figure 6B:
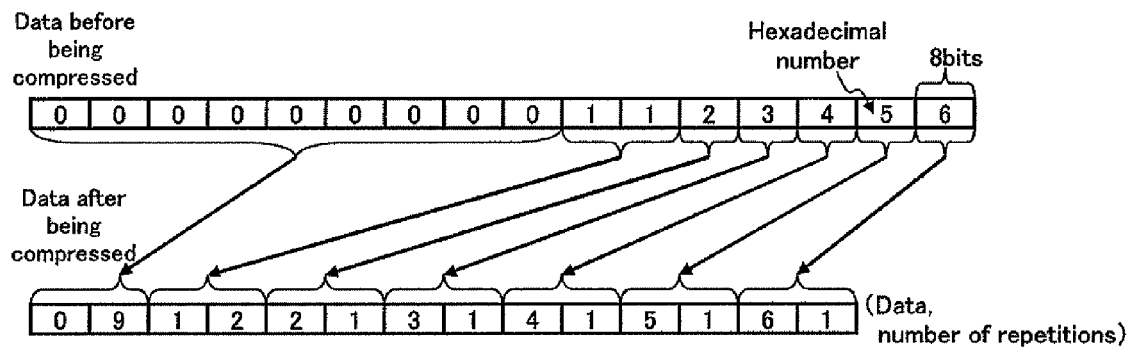
FIG. 6B is a diagram showing data compression by the run length method when the number of repetitions of the same data is small.

According to the first encoding method, in the case where the number of repetitions of the same data is large, the compression ratio increases, while in the case where the number of repetitions of the same data is small, the compression ratio decreases, as shown in FIG. 6B.

Figure 6C:
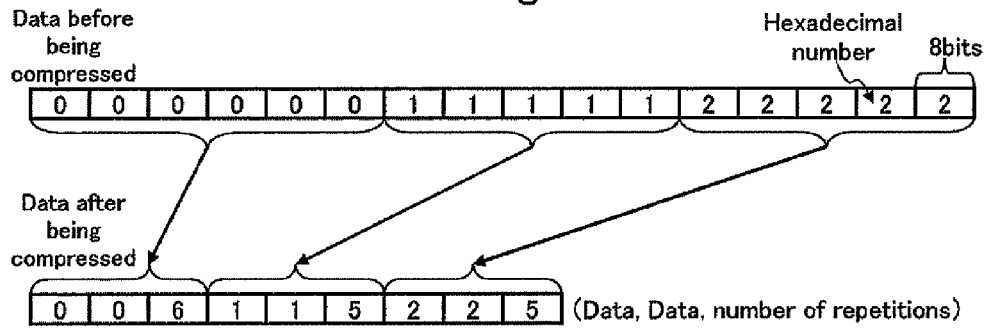
FIG. 6C is a diagram showing data compression by a method by which a compression ratio is kept high even when the number of repetitions of the same data is small.
Figure 6D:
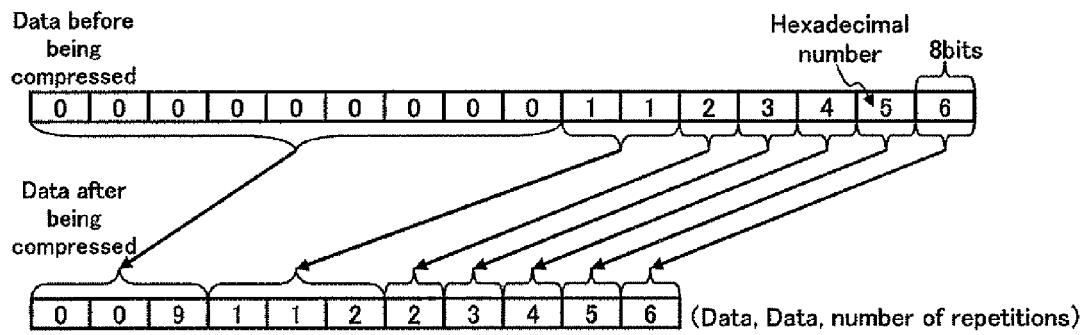
FIG. 6D is a diagram showing another example of the data compression by a method by which a compression ratio is kept high even when the number of repetitions of the same data is small.

In the case where the number of repetitions of the same data is small, as shown in FIG. 6C and FIG. 6D, the compression ratio can be increased by employing such a compression algorithm that, when the same data occurs repeatedly in the run of data arranged in an arbitrary order, the run of data is converted into 3-byte data consisting of two bytes of successive arrangement of the data and one byte of expression of the number of repetitions of the data, while when there is no repetition of the same data in the run of data, one byte of the data is arranged as it is. This compression method will be hereinafter referred to as a "second encoding method."

In this regard, the binary data can be compressed on a bit basis in both methods.

The compression processing portion 3C is configured to employ either the first encoding method or the second encoding method according to the state of the vehicle and the like.

For example, in the case where the frequency of repetition of the same data is high, that is, in the case where the vehicle is in an idling state or is running at a constant speed, the compression processing portion 3C carries out the compression processing by the first encoding method, while in the case where the frequency of repetition of the same data is low, that is, in the case where the vehicle speed frequently varies while the vehicle is running, the compression processing portion 3C carries out switching so as to carry out the compression processing by the second encoding method.

As another example, the compression processing portion 3C may switch between the first encoding method and the second encoding method on the basis of the kind of the binary data.

In other words, the compression processing portion 3C divides the difference frame data into two groups including a group of data having a low variation probability of data and a group of data having a high variation probability in order to carry out the compression processing of the group of data having a low variation probability of data by the first encoding method and the compression processing of the group of data having a high variation probability of data by the second encoding method.

Further, as still another example, the compression processing portion 3C may compress, among the difference frame data, only binary data expressing an event having a low variation probability.

In other words, the compression processing portion 3C divides the difference frame data into two groups including a group of binary data expressing an event having a low variation probability (a group of data having a small degree of data variation) and a group of binary data expressing an event having a high variation probability (a group of data having a large degree of data variation) in order to carry out the compression processing of the group of data having a small degree of data variation by the first encoding method and does not carry out the compression processing of the group of data having a high variation probability of data but outputs the group of data.

In the case where the difference frame data compressed in this manner is decompressed to reproduce the original frame data, at least one piece of frame data before being compressed is required. This is because the original frame data cannot be reproduced only by the difference frame data.

In view of this, in order to acquire the original frame data to serve as base data required at the time of decompression, the compression processing portion 3C is configured to subject at least one piece of frame data to the compression processing as it is.

For example, the compression processing portion 3C may be configured to carry out the compression processing of first frame data, which serves as a computation target of the first difference frame data, as it is among the plurality of pieces of frame data.

Figure 7A:
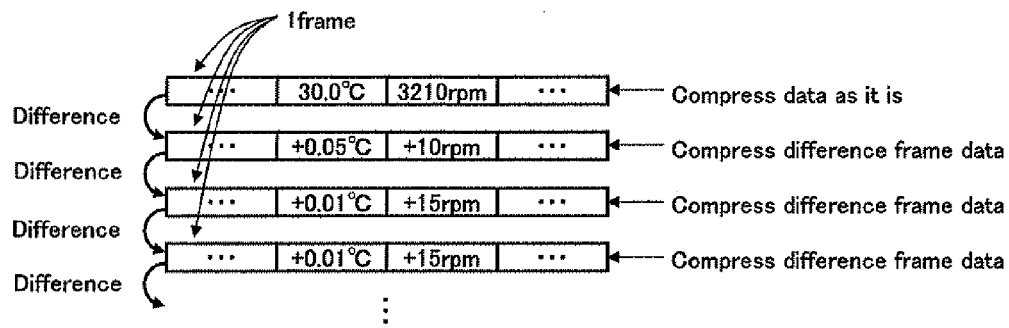
FIG. 7A is a diagram showing a case where only frame data input first after an ignition switch is turned on is compressed as it is.

Referring to FIG. 7A, the ignition switch of the vehicle is turned on and then the frame data (frame data shown on the first row in FIG. 7A) produced by the frame producing portion 3A on the basis of control data first input to the data processing device 3 from the ECUs 2 is output without being subjected to the difference processing by the difference computing portion 3B and is compressed as it is by the compression processing portion 3C as base data for data decompression.

Then, second and later frame data produced thereafter are computed by the difference computing portion 3B and the output difference frame data (the frame data of the second and later rows shown in FIG. 7A) are successively compressed by the compression processing portion 3C.

In the example shown in FIG. 7A, in the case where any difference frame data of the compressed difference frame data stored in the recording portion 35 is lost by data corruption or the like, all of the subsequent difference frame data cannot be reproduced.

In this case, it suffices to configure the difference frame data in the following manner: that is, a plurality of pieces of frame data produced by the frame producing portion 3A are grouped into a predetermined number of frames; the first frame data of each group is compressed as it is by the compression processing portion 3C; and the second and later frame data are computed by the difference computing portion 3B and the output difference frame data are successively compressed by the compression processing portion 3C.

With this configuration, even if at least a part of the difference frame data in the group is lost, the frame data of the other groups can be reproduced.

Figure 7B:
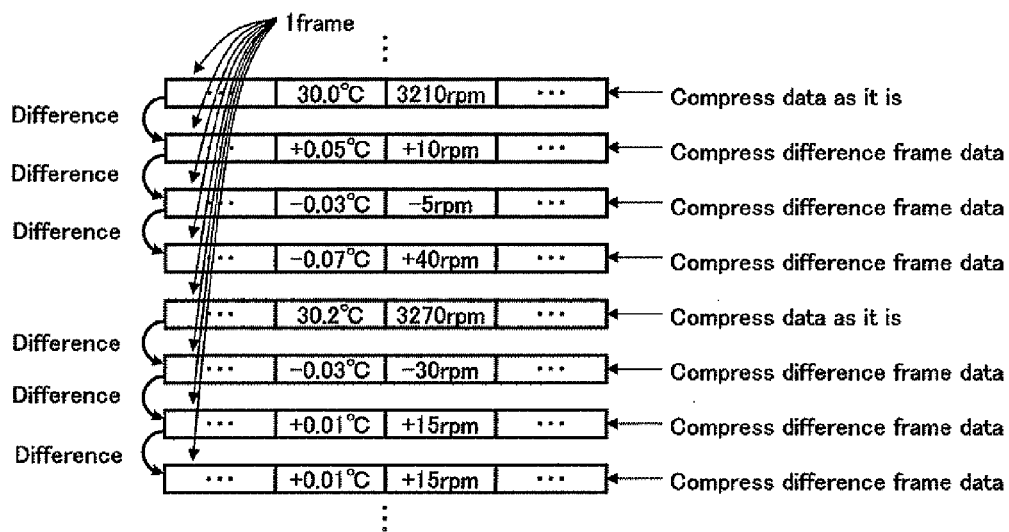
FIG. 7B is a diagram showing a case where frame data is compressed as it is at intervals of a predetermined number of frames.

FIG. 7B shows an example where: the frame data produced successively by the frame producing portion 3A are grouped on a four frame basis; only the first frame data of each group is subjected to the compression processing as it is; and the frame data of second and later frame data are subjected as difference frame data to the compression processing.

As another example, such a configuration may be employed that the frame data in the following manner: that is, a plurality of pieces of frame data before being compressed are grouped in such a manner that the amount of data after being subjected to the compression processing and stored in the recording portion 35 becomes approximately constant; the first frame data of each group is compressed as it is by the compression processing portion 3C; the frame data of the second and later frame data are computed by the difference computing portion 3B; and the output difference frame data are successively compressed by the compression processing portion 3C.

Figure 7C:
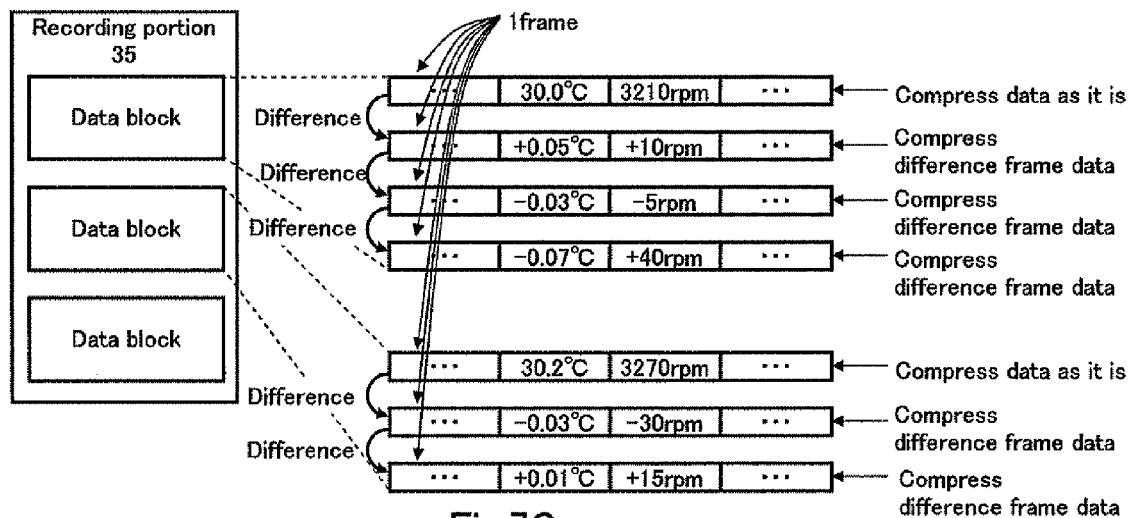
FIG. 7C is a diagram showing compression processing of frame data to show a case where frame data is compressed as it is for each data block of a constant size.

FIG. 7C shows, on the left side, the recording portion 35 in which a plurality of data blocks each having a predetermined amount of data are delimited and, on the right side, frame data before being compressed and difference frame data that correspond to the approximately constant amount of compressed data that is to be stored in each data block.

Four pieces of frame data are compressed and stored in the data block of an upper row, and three pieces of frame data are compressed and stored in the data block of a middle row.

The amount of the frame data after being subjected to the compression processing and the amount of the difference frame data after being subjected to the compression processing are greatly different from each other according to the binary data constituting the frame data and the difference frame data. However, by varying the number of pieces of frame data stored in one data block, an approximately constant amount of data can be stored in each data block.

With this configuration, even if a part of data in at least one data block is lost, the frame data of the other data blocks can be reproduced.

With any of the above configurations, when the frame data and the difference frame data are compressed by the compression processing portion 3C, the compressed data corresponding to the first frame data, the number of difference computations, and the compressed data corresponding to the difference frame data are stored in the frame data storage regions delimited in the recording portion 35 (non-volatile memory 323) by the storage processing portion 3D.

As used herein, the "number of difference computations" means the number of times of successive difference processing by the difference computing portion 3B, and the value of the number at the time of completion of the compression processing is a value obtained by subtracting one from the number of the original frame data.

The difference between the first frame data and base frame data common to a device for decompressing the frame data may be computed to produce the difference frame data. As for the common base frame data, for example, frame data in which all bits are 0 or 1 can be employed. In this case, the number of difference computations at the time of completion of the compression processing becomes equal to the number of the original frame data.

The frame data storage region is set to a sufficient amount to store the compressed data produced at predetermined intervals, specifically, at intervals of 500 msec for at least a predetermined period, preferably, for 120 hours.

Further, the storage processing portion 3D operates in the following manner: that is, the storage processing portion 3 stores the compressed data in the frame data storage regions successively from the first memory address to the final memory address; and when the storage processing portion 3D stores the compressed data in the frame data storage region of the final memory address, then the storage processing portion 3D next overwrites the frame data storage regions from the first memory address with the newest compressed data. In other words, the frame data storage regions are used as ring memories.

With this configuration, even when a plurality of pieces of varying control data are received successively, the plurality of pieces of control data are processed in such a manner that the pieces of control data expressing events each having a small degree of variation are arranged so as to be dose to each other to thereby produce a frame, so that a high compression ratio can be obtained.

The compressed frame data and the like subjected to the compression processing by the compression processing portion 3C and stored in the recording portion 35 are read by the external tool 6 and then are decompressed by the external tool 6.

The first compressed frame data is decoded into frame data and the next compressed difference frame data is decoded into difference frame data, and the frame data is added to the difference frame data to thereby produce the second frame data. Subsequently, by carrying out this processing repeatedly, a run of frame data can be decoded.

Hereinafter, an example of the processing of the data processing device 3 according to the present invention will be described on the basis of a flowchart shown in FIG. 8 and FIG. 9.

Referring to FIG. 7C, the following description is about an example where: the frame data before being compressed are grouped in such a manner that the amount of data after being subjected to the compression processing to be stored in the recording portion 35 becomes approximately constant; the first frame data in each group is compressed as it is by the compression processing portion 3C; the second and later frame data are computed by the difference computing portion 3B; and the output difference frame data is successively compressed by the compression processing portion 3C.

Figures 10A, 10B:
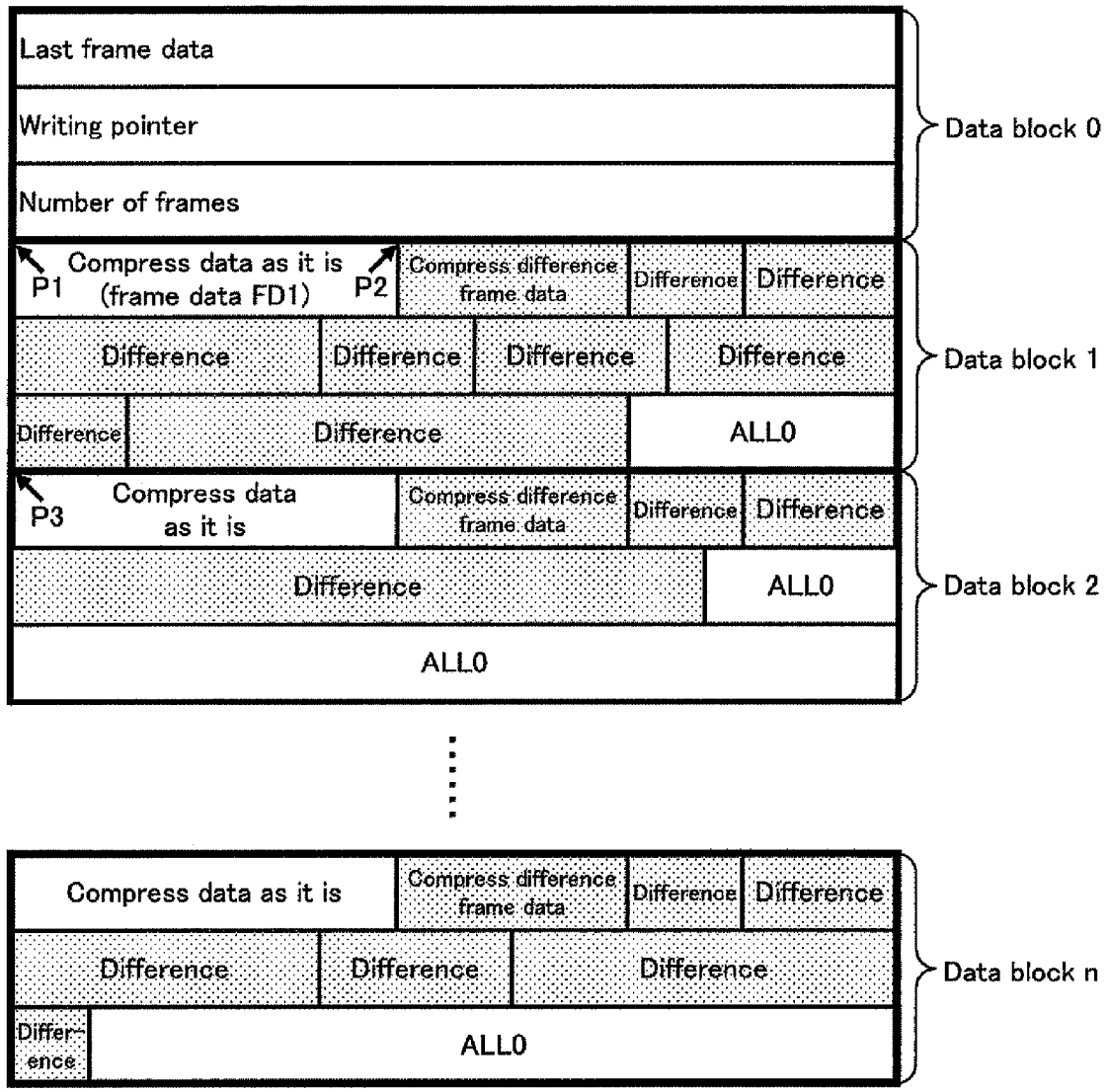
FIG. 10A is a diagram showing a configuration of a non-volatile memory (recording portion)
FIG. 10B is a diagram showing an initial state of the non-volatile memory.

Referring to FIG. 10A, the recording portion 35 (non-volatile memory 323) is divided into data blocks ranging from a data block 0 to a data block n each having a predetermined amount, and each of the data blocks 1 to n is a division of a constant amount. In the first data block 0 is stored set data necessary for the compression processing and the storing processing.

The set data includes: the frame data that served as the target of the last compression processing (hereinafter referred to as "last frame data"); a writing pointer for specifying a storage address of the data after being compressed; and the number of pieces of frame data (hereinafter referred to as "the number of frames") that are already stored in a current writing target data block. The number of frames corresponds to the number of difference computations that has been described above.

Referring to FIG. 10B, when the data processing device 3 is shipped, the set data are set at initial values. Specifically, the storage region of "the last frame data" has zero stored therein; the storage region of "the writing pointer" has the first address (address indicated by P1 in FIG. 10A) of the data block 1 stored therein; and the storage region of "the number of frames" has zero stored therein.

When the ignition switch of the vehicle turned on and the ECUs 2 and the data processing device 3 allow the transmission and reception of the data through the network (CAN) 4 (SA1), then the storage processing portion 3D reads the value of the writing pointer from the non-volatile memory 323 (SA2). The value of the writing pointer is initially set to the address indicated by P1 in FIG. 10A.

The storage processing portion 3D computes the remaining amount of a corresponding data block (data block 1 shown in FIG. 10A) on the basis of the value of the read writing pointer (SA3), and reads the last frame data from the data block 0 (SA4).

When a predetermined period, specifically, 500 msec passes after the ignition switch is turned on (SA5), the frame producing portion 3A produces frame data (shown in FIG. 5C) arranged in ascending order of data variation on the basis of the binary data (shown in FIG. 5B) input to the data processing device 3 from the ECUs 2 (SA6).

The difference computing portion 3B computes the difference between the frame data currently produced by the frame producing portion 3A in step SA6 and the frame data formerly produced, thereby producing difference frame data (SA7). Here, "the frame data formerly produced" becomes the last frame data read in the step SA4, that is, zero of the initial value.

The compression processing portion 3C refers to "the number of frames" stored in the data block 0 (SA8), and when "the number of frames" is zero, the compression processing portion 3C subjects the frame data produced in the step SA6 to the compression processing (SA9), while when "the number of frames" is other than zero, the compression processing portion 3C subjects the difference frame data produced in the step SA7 to the compression processing (SA10).

In other words, when "the number of frames" is zero, the compression processing portion 3C judges that the frame data is the first frame data and hence subjects the frame data before being subjected to the difference computing processing to the compression processing, while when "the number of frames" is other than zero, the compression processing portion 3C subjects the difference frame data to the compression processing.

When the amount of data of the frame data or the difference frame data subjected to the compression processing in the step SA9 or in the step SA10 is equal to or less than the remaining amount of the data block computed in the step SA3 (SA11) and when "the number of frames" stored in the data block 0 is zero (SA12), then the storage processing portion 3D writes the frame data subjected to the compression processing in the step SA9 to the address indicated by the current writing pointer (SA13).

When "the number of frames" is other than zero (SA12), the storage processing portion 3D writes the difference frame data subjected to the compression processing in the step SA10 to the address indicated by the current writing pointer (SA14).

At the initial stage, "the number of frames" is zero and hence the processing in the step SA13 is carried out and the compressed frame data is stored in the address indicated by P1 in FIG. 10A.

Thereafter, the storage processing portion 3D writes the frame data produced in the step SA6 to the storage region of "the last frame data" of the data block 0 so as to use the frame data for computing the next difference frame data (SA23).

Further, the storage processing portion 3D updates the value of the storage region of "the writing pointer" (SA4). In other words, the storage processing portion 3D adds the amount of compressed data stored this time to the value of the storage region of "the writing pointer". At the initial stage, the value of the storage region of "the writing pointer" is updated to the address indicated by P2 in FIG. 10A.

The storage processing portion 3D subtracts the amount of the compressed data currently stored from the remaining amount of data computed in the step SA3 to compute the newest remaining amount of data (SA25) and increments "the number of frames" (SA26).

When judging in the step SA11 that the amount of data of the frame data or the difference frame data subjected to the compression processing in the step SA9 or the step SA10 is larger than the remaining amount of data of the data block, the storage processing portion 3D writes zero to the storage region from the address indicated by the writing pointer to the final region of the data block (SA15).

Further, the storage processing portion 3D updates the value of the storage region of the "writing pointer" to the first address of the next data block (SA16) and updates the remaining amount of the data block to the value of the full amount of the data block (SA17).

For example, when the remaining amount of data block 1 shown in FIG. 10A becomes smaller than the amount of the compressed data, the storage processing portion 3D writes 0 to the vacant region of the data block 1, updates the value of the storage region of the "writing pointer" to the first address of the data block 2, and updates the remaining amount of data block to the full amount of the data block 2.

The storage processing portion 3D refers to "the number of frames" (SA18), and when "the number of frames" is zero, the storage processing portion 3D writes the frame data subjected to the compression processing in the step SA9 to the current writing pointer position P3 (SA19). It should be noted that usually, the amount of data after being compressed certainly becomes an amount smaller than the full amount of the data block, and hence passing through this path does not occur.

When "the number of frames" is other than zero (SA18), the storage processing portion 3D sets zero to "the number of frames" (SA20). Then, the compression processing portion 3C subjects the frame data produced in the step SA6 to the compression processing (SA21), and the storage processing portion 3D stores the frame data after being compressed to the address indicated by the "writing pointer" (SA22).

The data processing device 3 carries out a series of processing from steps SA6 to SA26 repeatedly at predetermined intervals, specifically, at intervals of 500 msec (SA28) until the ignition switch is turned off (SA27).

When the ignition switch is turned off (SA28), the storage processing portion 3D carries out post processing. For example, the storage processing portion 3D carries out the processing from steps SA15 to SA17 (SA29) and sets the "number of frames" of the data block 0 to zero (SA30). This enables the storage processing portion 3D to start writing data to the storage region from the start of the next data block when the ignition switch is next turned on.

In this regard, the data processing device 3 may be configured so as not to carry out the post processing of the steps SA29, SA30. In this case, when the ignition switch is next turned on (SA1), the frame data is written in the storage region from the middle of the data block.

In this case, when the ignition switch is turned off, the frame data stored in the RAM 322 is lost. However, the last frame data is stored in the storage region of the "last frame data" of the non-volatile memory 323 in the step SA23, so that the difference frame data can be successively produced.

The control method for compressing the binary data expressing an external varying event and for recording the compressed binary data is carried out by the procedure described above.

Figure 8:
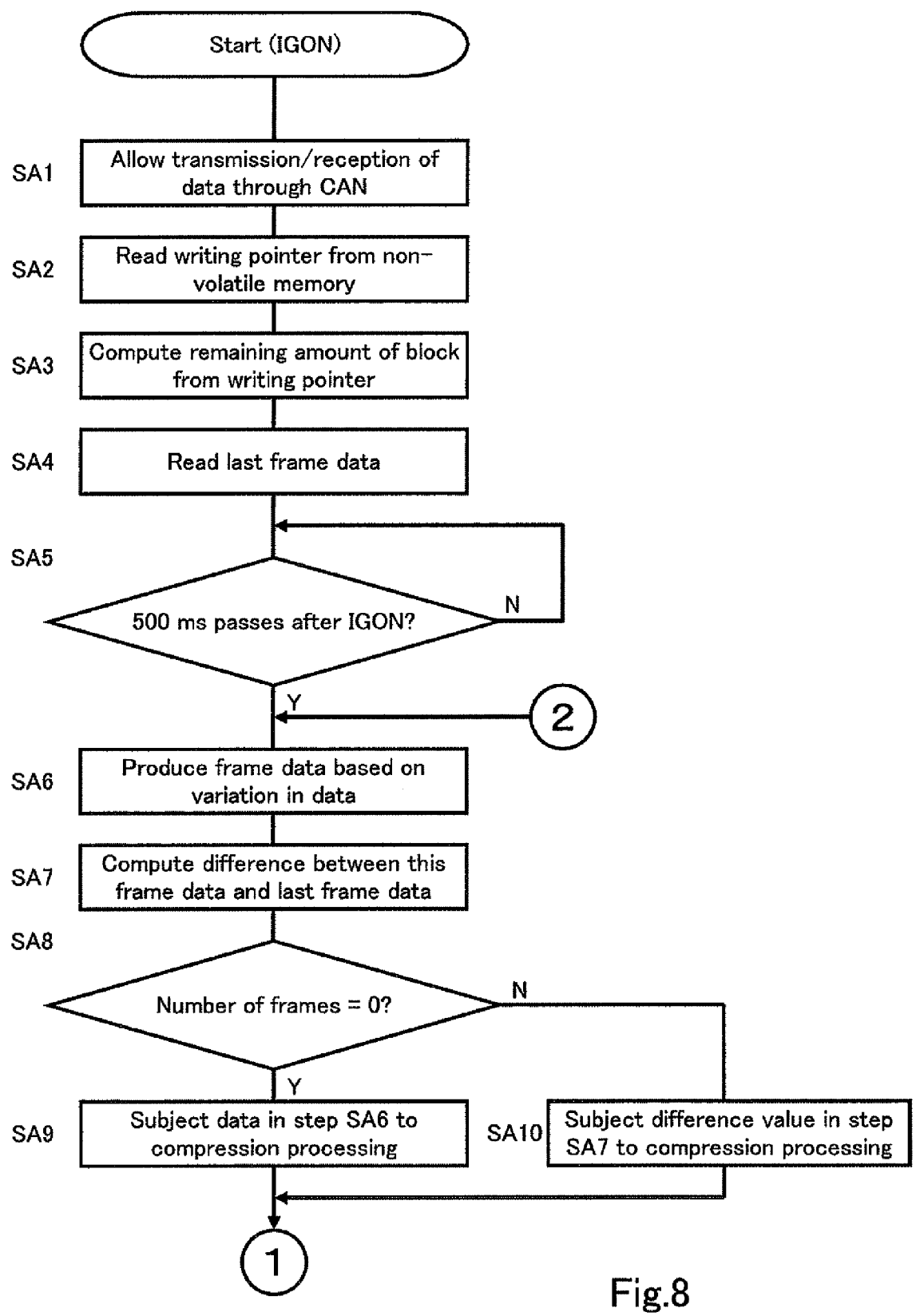
FIG. 8 is a flowchart showing the processing of a data processing device 3.

In other words, the production step of producing a frame in which of a plurality of pieces of binary data received successively from outside and accumulated and stored in the storage portion, pieces of data expressing events occurring in a predetermined period are placed into a group among which pieces of data expressing events each having a small degree of variation are arranged so as to be close to each other is carried out in the step SA6 shown in FIG. 8.

The difference computing step of computing the difference between two frames arranged adjacently to each other when the plurality of frames produced by the production step at intervals of the predetermined period are arranged in a predetermined order is carried out in the step SA7.

Figure 9:
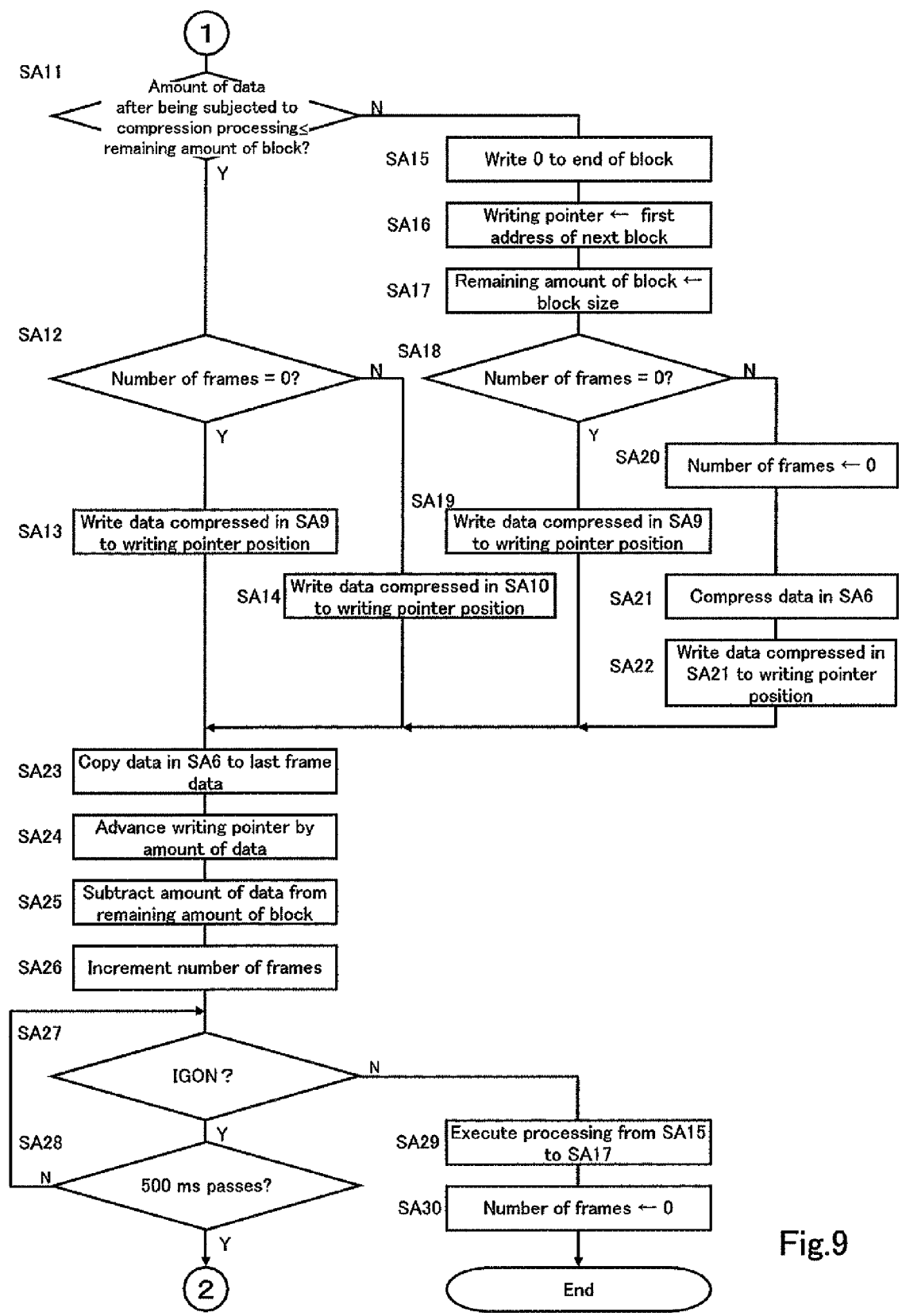
FIG. 9 is the flowchart showing the processing of the data processing device 3.

The compression step of compressing the computation result obtained by the difference computing step by the run length method is carried out in steps SA8 to SA10 shown in FIG. 8 and in the step SA21 shown in FIG. 9.

The recording step of recording the first frame in the difference computing step, the number of difference computations, and the data compressed by the compression step to the recording portion is carried out in steps SA2 to SA4, steps SA11 to SA20, and steps SA22 to SA26.

Hereinafter, another embodiment will be described.

While in the above embodiment description has been made of the configuration in which frame data having data arranged in ascending order of variation probability of the data is produced by the frame producing portion 3A, it is also possible to produce frame data in which pieces of data expressing events each having a small degree of data variation are arranged so as to be close to each other.

For example, it is also possible to produce frame data in which the data is arranged in descending order of data variation or the frame data in which pieces of data expressing events each having a small degree of data variation are arranged so as to be close to each other in the central portion may be produced.

Further, the control portion 30 of the data processing device 3 may be provided with an error correction encoding processing portion for carrying out error detection data adding processing for adding data for detecting an error to the data compressed by the compression processing on a predetermined data basis different from the above-mentioned frame.

Figure 11A:
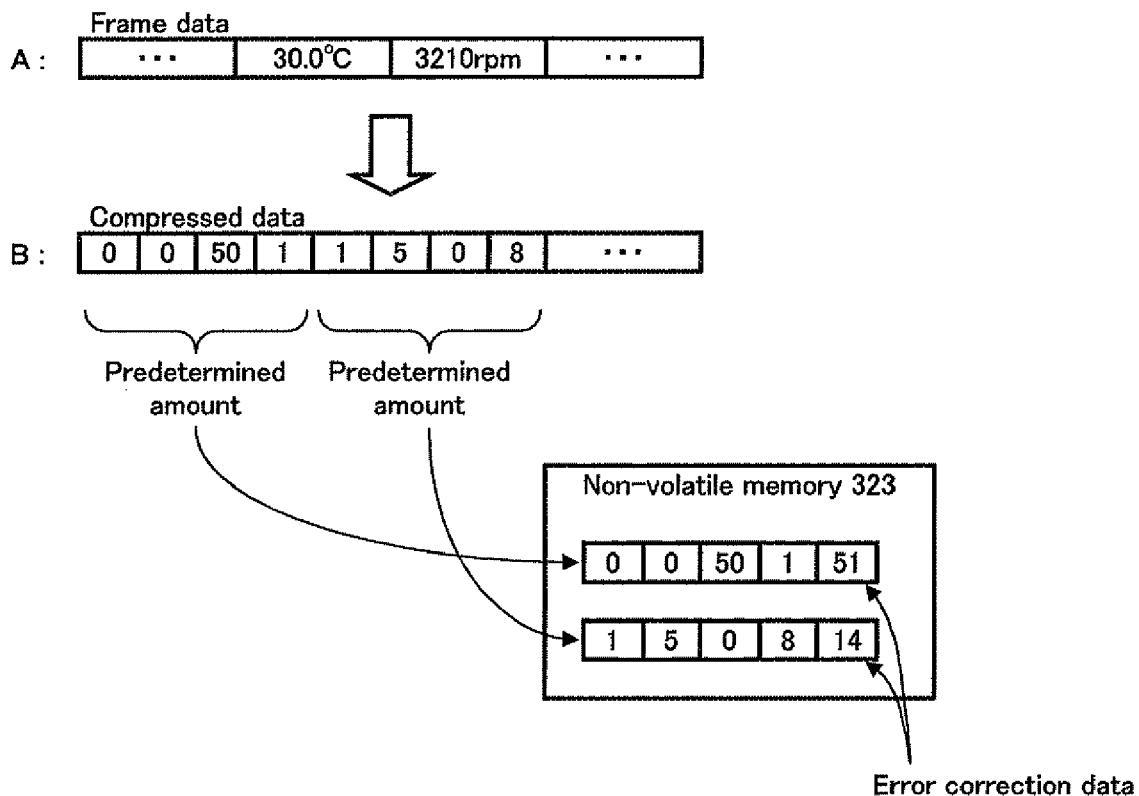
FIG. 11A is a diagram showing the addition of error correction data by an error correction encoding processing portion.

FIG. 11A shows a procedure by which the error detecting data is added by the error correction encoding processing portion.

The frame data (frame data shown by A in FIG. 11A) produced by the frame producing portion 3A is subjected to the compression processing by the compression processing portion 3C, whereby the compressed frame data (frame data shown by B in FIG. 11A) is produced.

The compressed frame data is divided into blocks on a predetermined amount basis by the error correction encoding processing portion, and one error detection data is added to one block. In FIG. 11A, the error detection data is set as the check sum of the data in the block so that a data error is detectable.

The error detection data may be parity data or may be error detection data produced by another publicly known method. Further, the error detection data capable of correcting the error such as BCH encoding processing may be added to the compressed data.

The compressed data having the error detection data added thereto is stored in the recording portion 35 by the storage processing portion 3D.

According to the above-mentioned configuration, the error correction data is added for each unit of a predetermined amount smaller than the compressed frame data by the error correction encoding processing portion, and hence the compressed data can be more correctly decoded than the case where the error correction data is added on a frame basis.

Contrarily, when the error detection data is added for each block of a predetermined amount larger than the compressed frame data by the error correction encoding processing portion, the amount is not much increased, which is suitable for the case where there is no room for the amount of the recording portion 35.

Figure 11B:
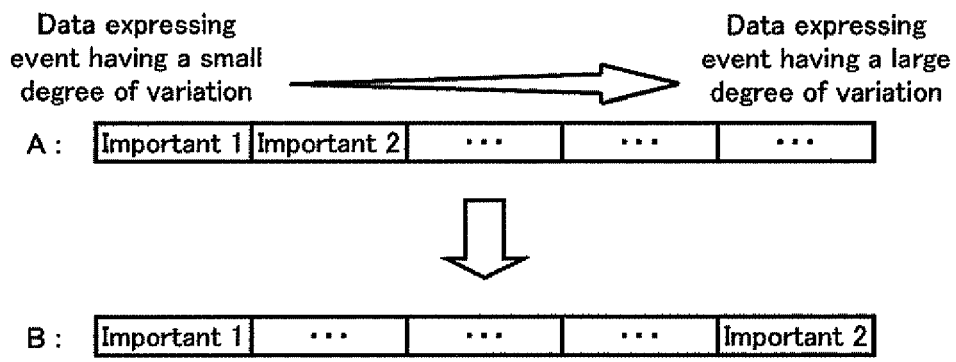
FIG. 11B is a diagram showing the separate arrangement of data by the error correction encoding processing portion.

In the case where important pieces of data are close to each other as shown by the frame data before being compressed shown by A in FIG. 11B, when the frame data is divided into a plurality of blocks by the error correction encoding processing portion, the probability of containing both important data in the same block increases.

In the case where both important data are contained in the same block, when an error occurs in the data, both data might be adversely affected. In this regard, the important data means control data such as the number of revolutions of the engine and the injection amount of fuel.

In view of this, it is preferable that, as shown in B of FIG. 11B, the frame producing portion 3A produces the frame data in such a manner that pieces of control data each having a high degree of importance are arranged separately from each other in the frame.

In this case, the compression ratio decreases, but when the compressed frame data is divided into blocks on a predetermined amount basis and the error correction data is added for each block, the probability of containing pieces of control data each having a high degree of importance in the same block decreases and hence safety can be ensured.

While in the above-mentioned embodiment description is made of the case where when the difference frame data is produced by the difference computing portion 3B for the frame data produced by the frame producing portion 3A, the frame data formerly produced is used as a reference for computing the difference frame data, the frame data used as the reference may be fixed. In this case, it suffices to compress the frame data used as the reference as it is.

In the case of grouping the frame data for producing the difference frame data as shown in FIG. 7B or FIG. 7C, it suffices to fix the frame data used as the reference in the group. Usually, the first frame data is used as the reference.

Figure 12:
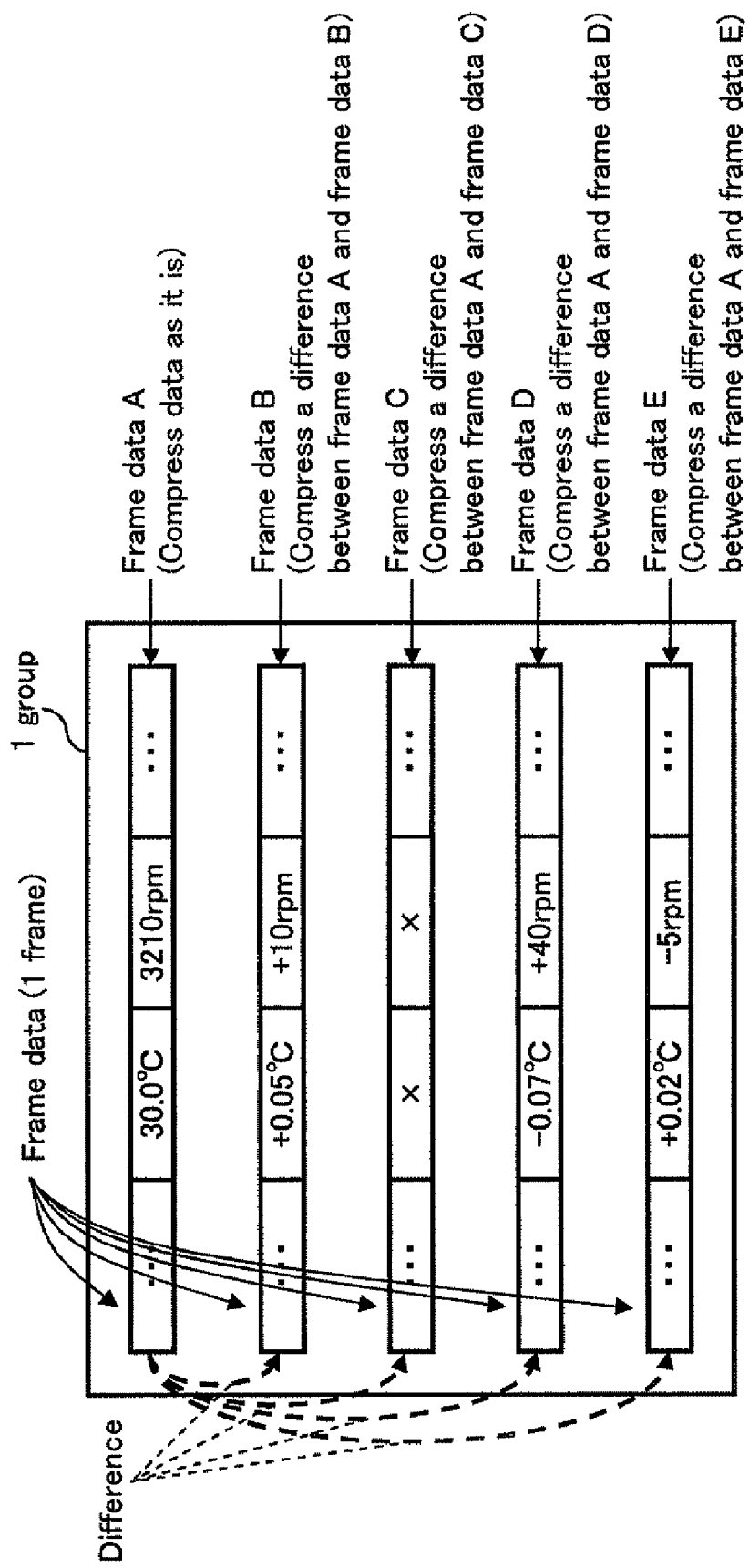
FIG. 12 is a diagram showing the compression processing of frame data in the case where difference frame data between one frame data and the other frame data in each group is computed.

FIG. 12 shows the case where one group is composed of five pieces of frame data and where the frame data A is used as the reference. In FIG. 12, the difference computations are carried out for the combinations shown by the broken arrows.

According to the above-mentioned configuration, even when any one of the difference frame data after being compressed is lost, if the frame data after being compressed of the reference is safe, the other difference frame data can be correctly decompressed.

In the above-mentioned embodiment description is made of the case where pieces of frame data in which pieces of binary data expressing events each having a small degree of variation in the data are arranged so as to be close to each other is produced by the frame producing portion 3A. However, when pieces of binary data expressing events each having a small degree of data variation vary depending on the state of the vehicle, the frame data may be configured in such a manner that the pieces of binary data expressing events each having a small degree of variation in the data are dynamically arranged.

In this case, the frame producing portion 3A may be configured to previously set a plurality of kinds of frame configurations with varying arrangements according to the state of the vehicle and to determine which kind of frame configuration to use to produce the frame data in accordance with the current state of the vehicle.

Figure 13:
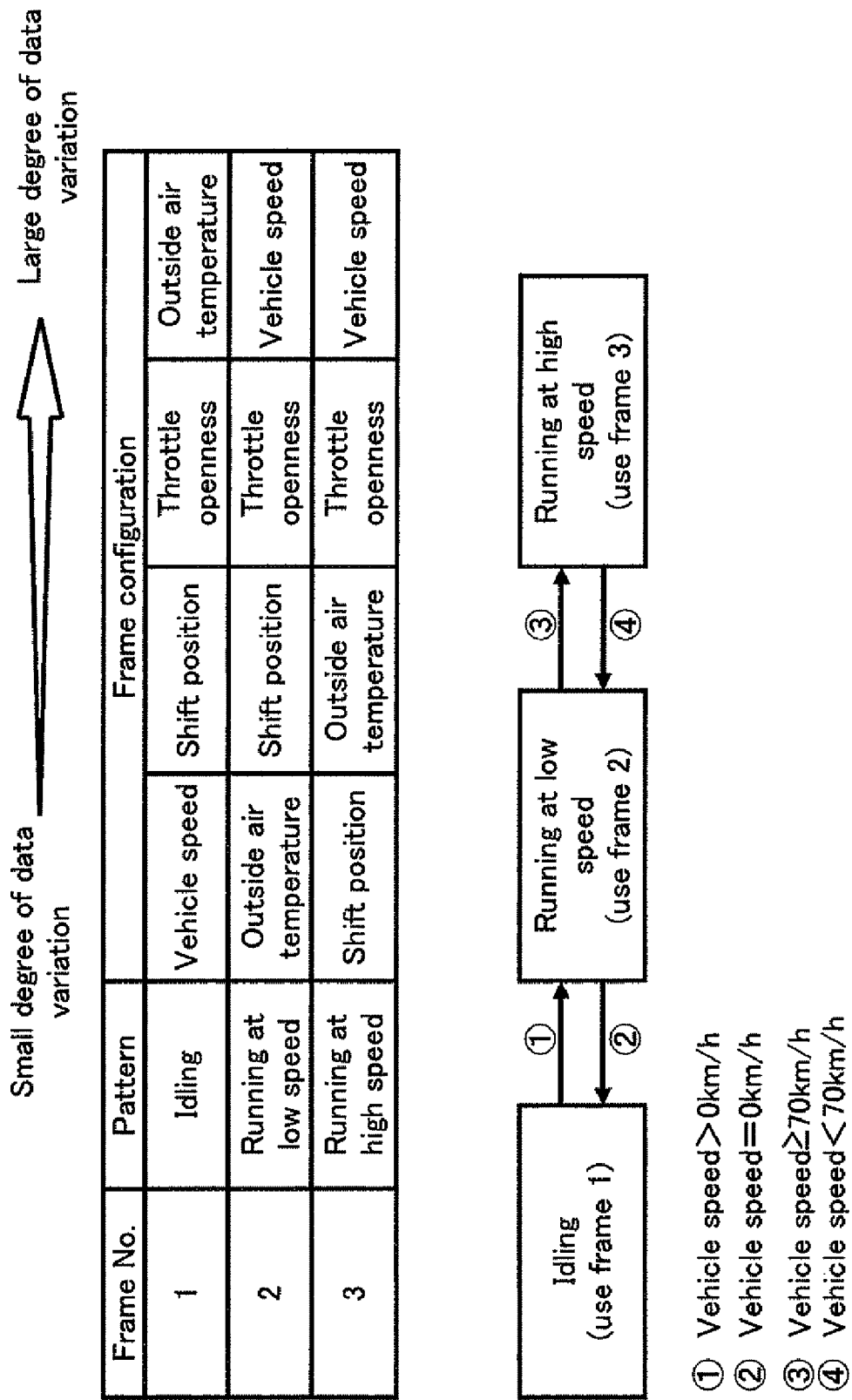
FIG. 13 is a diagram showing the switching of frame configuration by a frame producing portion.

FIG. 13 shows the case where the frame configuration to be used is determined according to the current speed of the vehicle. FIG. 13 shows the frame configuration of a frame number 1 corresponding to a vehicle speed of 0 km per hour (while the vehicle is idling), the frame configuration of a frame number 2 corresponding to a vehicle speed that is higher than the speed of 0 km per hour and lower than a speed of 70 km per hour (while the vehicle is running at a low speed), and the frame configuration of a frame number 3 corresponding to a vehicle speed equal to or higher than the speed of 70 km per hour (while the vehicle is running at a high speed). The frame producing portion 3A determines which of the frame configurations to use.

For example, in the frame configuration of the frame number 1, the vehicle speed data is arranged as the binary data expressing an event having a small degree of variation in the data, while in the frame configurations of the frame numbers 2 and 3 (while the vehicle is running at a low speed and at a high speed), the vehicle speed data is arranged as the binary data expressing an event having a large degree of data variation.

In this regard, the state of the vehicle for setting the frame configuration is not limited to the vehicle speed, but an arbitrary state of the vehicle in which the variation probability of the binary data varies such as the operating state of the brake and the shift position can be employed.

While in the above-mentioned embodiment description is made of the case where difference frame data computed by the difference computing portion 3B is subjected to the compression processing by the compression processing portion 3C on a one-by-one basis, the plurality of pieces of difference frame data computed by the difference computing portion 3B may be subjected collectively to the compression processing by the compression processing portion 3C.

For example, such a configuration may be employed that when the pieces of difference frame data computed by the difference computing portion 3B are temporarily stored in the RAM 23 or the like and the number of pieces of difference frame data reaches a predetermined number, the predetermined number of pieces of difference frame data are subjected as one block of data to the compression processing by the compression processing portion 3C.

When two pieces of frame data to be subjected to the difference computing processing are approximately equal to each other, almost all of data bits constituting the difference frame data become zero. In this case, when the above-mentioned configuration is employed, the pieces of difference frame data of this kind can be subjected collectively to the compression processing, thereby carrying out the compression processing at an extremely high compression ratio.

In this regard, the configuration in which the plurality of pieces of difference frame data are subjected collectively to the compression processing may be combined with the configuration in which binary data other than the binary data having a large degree of data variation is subjected to the compression processing, and only binary data having a small degree of data variation may be subjected collectively to the compression processing. If the compression processing portion 3C is configured to carry out the compression processing of this kind, the compression ratio can be further increased.

While in the above-mentioned embodiment the data processing device 3 is configured to compress the binary data transmitted from the ECUs 2 and to store the compressed data in the recording portion 35, at least one ECU 2 of the ECUs 2 may be configured to have the function as the data processing device 3 of compressing the binary data and of storing the compressed data in the recording portion 35.

One of the plurality of ECUs 2 mounted in the vehicle, for example, the engine ECU 2A may be configured to have the function blocks of the control portion 30 and the storage portion 32 disposed in the data processing device 3 and to compress the binary data transmitted from the other ECUs 2 and the various kinds of binary data processed by the engine ECU 2A itself and to store the compressed binary data in the recording portion 35.

A plurality of ECUs 2 may have the function as the data processing device 3 of compressing the binary data and of storing the compressed data in the recording portion 35. For example, all of the ECUs 2 may be configured to have the function as the data processing device 3 and to compress the binary data transmitted from the other ECUs 2 and/or the various kinds of binary data computed and derived by the ECU 2 itself and to store the compressed binary data in the recording portion 35.

While description is made of the cases where the data processing device 3 according to the present invention is applied as the data processing device of the vehicle to the data processing system 1 of the vehicle, a device that compresses binary data expressing external varying events and records the compressed binary data can be also applied to the data processing of electronic devices other than vehicles, examples including an airplane and an air conditioner.

When the control device according to the present invention is employed as a data processing device relating to the vehicle, the control device can be installed not only in the vehicle but also in an information management center outside the vehicle. In this case, the control data on the vehicle side is transmitted to the information management center via a radio communication portion disposed in the vehicle.

The embodiments of the present invention described above are only for exemplary purposes, and the specific configurations of the blocks and the like can be modified in design as appropriate within a scope to produce the operation and effect of the present invention.

What is claimed is:

1. A control device that compresses a plurality of different kinds of binary data, each kind of binary data expressing an external varying event, and records the compressed binary data, the control device comprising:
    a storage portion configured to accumulate and store the plurality of different kinds of binary data received successively from one or a plurality of external sources; and
    a control portion configured to carry out processing, the processing including:
    production processing of producing a frame, using a plurality of pieces of the plurality of different kinds of binary data accumulated and stored in the storage portion, in which pieces of the plurality of pieces expressing events occurring in a predetermined period are placed into a group among which pieces of the plurality of different kinds of binary data, predetermined as each having a small degree of variation at intervals of the predetermined period, are arranged so as to be close to each other;
    difference computing processing of arranging a plurality of frames, produced at intervals of the predetermined period by the production processing, in a predetermined order and of computing a difference between two adjacent frames;
    compression processing of compressing a computation result of the difference computing processing by a run length method; and
    recording processing of recording, to a recording portion, a first frame in the difference computing processing, a number of difference computations, and the data compressed by the compression processing.

2. The control device according to claim 1, wherein:
    the control portion carries out error detection data adding processing configured to add data for detecting an error with respect to each data compressed and divided into a predetermined size which is different from that of the compressed frame data.

3. The control device according to claim 2, wherein:
the production processing arranges pieces of the plurality of pieces, predetermined as each having a small degree of variation at intervals of the predetermined period while having a high degree of importance, separately from each other in the produced frame, and
the error detection data adding processing adds data for detecting an error with respect to each data compressed and divided into a predetermined size which is smaller than that of the compressed frame data, so as to add an error detection data to each of the data having a high degree of importance.

4. The control device according to claim 1, wherein:
the compression processing includes compressing binary data other than binary data predetermined as each having a large degree of variation at intervals of the predetermined period in a frame serving as a compression target.

5. A control device that compresses a plurality of different kinds of binary data input from an electronic control unit mounted in a vehicle, each kind of binary data expressing an external varying event, and records the compressed binary data, the control device comprising:
a storage portion for accumulating and storing the plurality of different kinds of binary data received successively from the electronic control unit; and
a control portion configured to carry out processing, the processing including:
production processing of producing a frame, using a plurality of pieces of the plurality of different kinds of binary data accumulated and stored in the storage portion, in which pieces of the plurality of pieces expressing events occurring in a predetermined period are placed into a group among which pieces of the plurality of different kinds of binary data, predetermined as each having a small degree of variation at intervals of the predetermined period in vehicle control, are arranged so as to be close to each other;
difference computing processing of arranging a plurality of frames, produced at intervals of the predetermined period by the production processing, in a predetermined order and of computing a difference between two adjacent frames;
compression processing of compressing a computation result of the difference computing processing by a run length method; and
recording processing of recording, to a recording portion, a first frame in the difference computing processing, a number of difference computations, and the data compressed by the compression processing.

6. The control device according to claim 5, wherein:
the production processing includes producing a frame in which pieces of the plurality of different kinds of binary data, predetermined as each having a small degree of variation at intervals of the predetermined period according to a state of a vehicle, are dynamically arranged so as to be close to each other according to a state of the vehicle.

7. A control system of a vehicle, wherein:
a plurality of electronic control units, each controlling a controlled portion of the vehicle, and a control device according to claim 5 are connected to each other through a network; and the control device receives the plurality of different kinds of binary data transmitted successively from the electronic control units through the network and accumulates and stores the binary data in the storage portion.

8. The control system of a vehicle according to claim 7, wherein:
the production processing includes producing a frame in which pieces of the plurality of different kinds of binary data, predetermined as each having a small degree of variation at intervals of the predetermined period according to a state of a vehicle, are dynamically arranged so as to be close to each other according to a state of the vehicle.

9. A control method for compressing a plurality of different kinds of binary data, each kind of binary data expressing an external varying event, and for recording the compressed binary data, the control method comprising the steps of:
a production step of producing a frame, using a plurality of pieces of the plurality of different kinds of binary data transmitted successively from an external source and accumulated and stored in a storage portion, in which pieces of the plurality of pieces expressing events occurring in a predetermined period are placed into a group among which pieces of the plurality of different kinds of binary data, predetermined as each having a small degree of variation at intervals of the predetermined period, are arranged so as to be close to each other;
a difference computing step of arranging a plurality of frames, produced at intervals of the predetermined period in the production step, in a predetermined order and of computing a difference between two adjacent frames;
a compression step of compressing a computation result of the difference computing step by a run length method; and
a recording step of recording, to a recording portion, a first frame in the difference computing step, a number of difference computations, and the data compressed in the compression step.

10. A control device that compresses a plurality of different kinds of binary data, each kind of binary data expressing an external varying event, and records the compressed binary data, the control device comprising:
a storage portion configured to accumulate and store the plurality of different kinds of binary data received successively from one or a plurality of external sources; and
a control portion configured to carry out processing, the processing including:
production processing of producing a frame, using a plurality of pieces of the plurality of different kinds of binary data accumulated and stored in the storage portion, in which pieces of the plurality of pieces expressing events occurring in a predetermined period are placed into a group among which pieces of the plurality of different kinds of binary data, predetermined as each having a small degree of variation at intervals of the predetermined period, are arranged so as to be close to each other;
difference computing processing of arranging a plurality of frames, produced at intervals of the predetermined period by the production processing, in a predetermined order and of computing a difference between two adjacent frames;
compression processing of compressing a computation result of the difference computing processing by a run length method;
the error detection data adding processing configured to add data for detecting an error with respect to each data compressed and divided into a predetermined size which is different from that of the compressed frame data so as to add an error detection data to each of the data; and recording processing of recording, to a recording portion, a first frame in the difference computing processing, a number of difference computations, and the data compressed by the compression processing, wherein:

the production processing arranges pieces of the plurality of pieces, predetermined as each having a small degree of variation at intervals of the predetermined period while having a high degree of importance, separately from each other, in the produced frame and the error detection data adding processing adds data configured to detect an error with respect to each data compressed and divided into a predetermined size, smaller than that of the compressed frame data, so as to add an error detection data to each of the data having a high degree of importance.

* * * * *